United States Patent
Gabric et al.

(10) Patent No.: US 8,233,345 B2
(45) Date of Patent: Jul. 31, 2012

(54) PHASE CHANGE MEMORY CYCLE TIMER AND METHOD

(75) Inventors: John A Gabric, Essex Junction, VT (US); Mark C. Lamorey, South Burlington, VT (US); Thomas M. Maffitt, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 12/877,628

(22) Filed: Sep. 8, 2010

(65) Prior Publication Data

US 2012/0057401 A1    Mar. 8, 2012

(51) Int. Cl.
*G11C 7/02* (2006.01)

(52) U.S. Cl. ........ 365/210.1; 365/148; 365/189.14; 365/189.16; 365/233.1; 365/196

(58) Field of Classification Search ........ 365/210.1, 365/148, 189.14, 189.16, 233.1, 196
See application file for complete search history.

(56) References Cited

U.S. PATENT DOCUMENTS

| | | | |
|---|---|---|---|
| 7,190,607 B2 | 3/2007 | Cho et al. | |
| 7,245,526 B2 | 7/2007 | Oh et al. | |
| 7,372,725 B2 | 5/2008 | Philipp et al. | |
| 7,388,775 B2 | 6/2008 | Bedeschi et al. | |
| 7,541,609 B2 | 6/2009 | Nirschl et al. | |
| 7,626,860 B2 | 12/2009 | Lamorey et al. | |
| 7,652,914 B2 | 1/2010 | Nirschl et al. | |
| 7,660,152 B2 | 2/2010 | Lamorey et al. | |
| 2004/0022085 A1 | 2/2004 | Parkinson et al. | |
| 2008/0117697 A1 | 5/2008 | Philipp et al. | |
| 2008/0247217 A1 * | 10/2008 | Ruf | 365/148 |

FOREIGN PATENT DOCUMENTS

CN    1905077 A    1/2007

OTHER PUBLICATIONS

A. Redaelli et al., "Electronic Switching Effect and . . . in Chalcogenide Materials", IEEE Electron Device Letters, vol. 25, No. 10, Oct. 2004, pp. 684-686.

* cited by examiner

*Primary Examiner* — Thong Q Le
(74) *Attorney, Agent, or Firm* — David Cain; Roberts Mlotkowski Safran & Cole, P.C.

(57) ABSTRACT

A phase change memory (PCM) cycle timer and associated method are disclosed. A system includes at least one reference phase change element (PCE). The system also includes a circuit that performs a write operation on the at least one reference PCE and substantially immediately thereafter continuously senses and returns a value of a resistance of the at least one reference PCE throughout a settling time of the at least one reference PCE.

21 Claims, 5 Drawing Sheets

PHASE CHANGE MEMORY CYCLE TIMER AND METHOD

FIELD OF THE INVENTION

The invention relates to semiconductor structures and methods of manufacture and, more particularly, to phase change memory (PCM) cycle timer and associated method.

BACKGROUND

Dynamic Random Access Memory (DRAM) integrated circuit arrays have been existence for several years, with their dramatic increase in storage capacity having been achieved through advances in semiconductor fabrication technology and circuit design technology. The considerable advances in these two technologies have also resulted in higher and higher levels of integration that permit dramatic reductions in memory array size and cost, as well as increased process yield.

A DRAM memory cell typically includes, as basic components, an access transistor (switch) and a capacitor for storing a binary data bit in the form of a charge. Typically, a first voltage is stored on the capacitor to represent a logic HIGH or binary "1" value (e.g., $V_{DD}$), while a second voltage on the storage capacitor represents a logic LOW or binary "0" value (e.g., ground). A basic drawback of a DRAM device is that the charge on the capacitor eventually leaks away and therefore provisions must be made to "refresh" the capacitor charge, otherwise the data bit stored by the memory cell is lost.

The memory cell of a conventional Static Random Access Memory (SRAM), on the other hand, includes, as basic components, an access transistor or transistors and a memory element in the form of two or more integrated circuit devices interconnected to function as a bistable latch. An example of such a bistable latch is a pair of cross-coupled inverters. Bistable latches do not need to be "refreshed," as in the case of DRAM memory cells, and will reliably store a data bit indefinitely so long as they continue to receive supply voltage. However, such a memory cell requires a larger number of transistors and therefore a larger amount of silicon real estate than a simple DRAM cell, and draws more power than a DRAM cell. Like a DRAM array, an SRAM array is also a form of volatile memory in that the data is lost once power is removed.

Phase Change Random Access Memory ("PCRAM" also referred to as "PRAM" and generally as phase change memory "PCM") is an emerging non-volatile memory technology which stores data using phase change materials (such as Ge—Sb—Te (GST) alloys) having a programmable electrical resistance that changes with temperature. Other compositions such as $GeSb_4$, (including substitution/addition of other elements) are also possible for the phase change materials. Individual phase change elements (PCE) are thus used as the storage cells of a memory device. The state of an individual PCE is programmed through a heating and cooling process which is electrically controlled by passing a current through the PCE (or a discrete heating element in proximity to the PCE) and the resulting ohmic heating that occurs. Depending upon the specific applied temperature and duration of heating applied to the PCE element, the structure is either "set" to a lower resistance crystalline state or "reset" to an amorphous, higher resistance state.

The changing of the phase of a PCE typically requires a high temperature (e.g., above 200° C. to 900° C. depending on material properties), as can be obtained by Joule heating from current flowing through the phase change material or discrete resistor. When the phase change material is heated above its melting temperature to thereafter be quickly cooled, the phase change material becomes amorphous to store a data bit of "1." Alternatively, when the phase change material is heated above its crystallization temperature and maintained at that temperature for a predetermined time before cooling, the phase change material becomes crystalline to store a data bit of "0."

In an exemplary thermal cycling operation of a phase change material used as a PCE storage cell a first thermal cycling operation includes a "RESET" pulse for converting the PCE from crystalline to amorphous form, and a second thermal cycling operation includes a "SET" pulse for converting the PCE from amorphous to crystalline form. During the RESET pulse, the temperature of the PCM is raised above its melting temperature ($T_m$), followed by a rapid quench over a short time $t_1$. As a result of the rapid quench, the disordered arrangement of atoms of the PCM due to the melt is retained. Thus, the PCM is left in an amorphous, high resistive state after the RESET pulse. During the SET pulse, the PCM is annealed at a lower temperature with respect to the melting temperature, and for a longer time $t_2$ with respect to $t_1$. This process enables the amorphous form to crystallize into a lower resistive state.

An aspect to the feasibility of PCE memory technology is the ability to design large-scale arrays so as to allow random access of millions of bits. This may be done, for example through an array of PCEs, each gated by associated access transistors using a matrix of word lines (WL) (e.g., formed from a polysilicon gate material) and bit lines (BL) (e.g., formed with metal interconnect material). The current passing through the PCE may be controlled via the bit line (BL) and/or word line (WL).

The material of the PCE requires a certain amount of time to "settle out" to a thermal and crystal equilibrium state after a write operation is performed, due to the fact that the material of the PCE is undergoing a structural change during the write operation. The time to settle out may, in some circumstances, be longer than the cycle time of the chip that is writing to and reading from the memory. For example, it might take 30 ns for a PCE to settle out after a write operation, whereas the cycle time of the chip may be 10 ns. This can lead to an undesired situation in which the chip attempts to read or write to the PCE before the PCE is ready for the next operation.

Accordingly, there exists a need in the art to overcome the deficiencies and limitations described hereinabove.

SUMMARY

In a first aspect of the invention, there is a system that includes at least one reference phase change element (PCE). The system also includes a circuit that performs a write operation on the at least one reference PCE and substantially immediately thereafter continuously senses and returns a value of a resistance of the at least one reference PCE.

In another aspect of the invention, there is a method that includes triggering a cycle timer associated with a portion of phase change memory (PCM). The triggering causes the cycle timer to: execute a write operation on a reference phase change element (PCE) associated with the portion of PCM; and sense a parameter of the reference PCE after the executing the write operation. The method also includes determining whether to permit or prevent subsequent writing to the portion of PCM based upon the sensed parameter.

In yet another aspect of the invention, there is a system that includes a memory controller associated with a phase change memory (PCM) array. The system also includes a cycle timer comprising at least one reference phase change element (PCE). A write command from the memory controller to a portion of the PCM array triggers the cycle timer to fill charge traps of the at least one reference PCE and thereafter continuously sense and return a value of a resistance of the at least one reference PCE.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the PCM cycle timer, which comprises the structures of the present invention. In still further embodiments, a method in a computer-aided design system is provided for generating a functional design model of the PCM cycle timer. The method comprises generating a functional representation of the structural elements of the PCM cycle timer.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to phase change memory (PCM) cycle timer and associated method. In accordance with aspects of the invention, a circuit is arranged as a sensor that monitors a property of a reference phase change element (PCE) after a write operation and prevents subsequent read/write operations to the PCM until the reference PCE has reached an equilibrium state. Implementations of the invention may include a system and method in which a reference PCE is written and substantially immediately thereafter sensed, wherein the sensing continuously returns a resistance value of the reference throughout its thermoelectric settling time.

In embodiments, when a write operation is performed on a portion of a PCM array, a similar write operation is concurrently performed on a reference PCE that is associated with a portion of a PCM array. For example, the electrical resistance of the reference PCE may be monitored using a circuit having an output voltage that is based on the electrical resistance of the reference PCE. When the output voltage (or the rate of change of the output voltage) is above a threshold value, read and/or write operations to the portion of the PCM array are prevented. On the other hand, when the output voltage (or the rate of change of the output voltage) is below the threshold value, read and/or write operations to the portion of the PCM array are permitted. In this manner, implementations of the invention monitor a reference PCE to ensure that the actual PCM array has attained a stable state prior to permitting subsequent read/write operations on the PCM.

Figure 1:
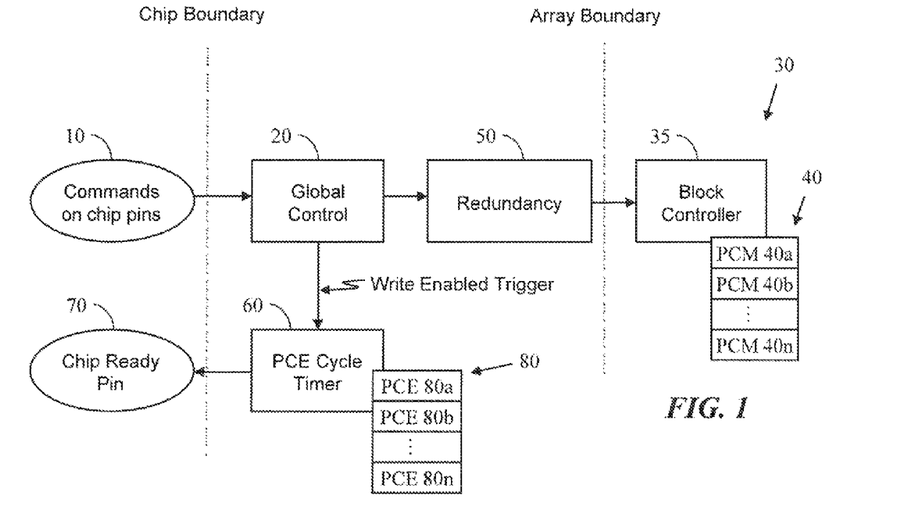
FIG. 1 shows a block diagram of a memory system in accordance with aspects of the invention.

FIG. 1 shows a system in accordance with aspects of the invention. In FIG. 1, element 10 represents commands on chip pins, such as I/O commands, addresses, and data that are supplied to a global control 20. In embodiments, the global control 20 comprises a memory controller and writes to and/or reads from memory 30 based on the commands 10. In embodiments, the memory 30 is a based on phase change memory (PCM) and comprises a block controller 35 and a plurality of discrete portions 40a-n of PCM. Each individual portion 40a-n of the PCM may comprise at least one PCE cell operating as a storage cell of the memory 30. The system may optionally include a redundancy cache 50, such as a plurality of SRAM registers.

According to aspects of the invention, the system additionally includes a PCE cycle timer 60 operatively connected between the global control 20 and a chip ready pin 70. In embodiments, the PCE cycle timer 60 comprises at least one reference PCE 80 that is structurally similar to the individual PCE cells comprised in memory 30. The global control 20 is configured such that when the global control 20 issues a write command to the memory 30, the global control 20 also simultaneously triggers the PCE cycle timer 60. In embodiments, triggering the PCE cycle timer 60 causes the PCE cycle timer 60 to: (i) hold the chip ready pin 70 in a logic high state, and (ii) execute a write command to the reference PCE 80. The PCE cycle timer 60 then monitors the reference PCE 80 to determine when the reference PCE 80 has reached a DC state, e.g., thermal and crystal equilibrium, which indicates that it is permissible to perform a subsequent read and/or write operation on the PCE cells in the memory 30.

In embodiments, the PCE cycle timer 60 includes a sensing circuit that monitors a property of the reference PCE 80 after the write command has been issued to the reference PCE 80. The sensing circuit is described in greater detail herein. The property is indicative of whether the reference PCE 80 is in a transient state or an equilibrium state after executing the write command on the reference PCE 80. In embodiments, when the sensing circuit detects that the reference PCE 80 is in a transient state, the PCE cycle timer 60 holds the chip ready pin 70 in the logic high state, which prevents a read and/or write command from being issued to the memory 30. On the other hand, when the sensing circuit detects that the reference PCE 80 is an equilibrium state, the PCE cycle timer 60 lowers the chip ready pin 70 to a logic low state, which informs the system that the memory 30 is ready for the next read and/or write command. In this manner, the system limits subsequent read and/or write operations on a previously written bit, e.g., unit of memory 30, for a given period of time to ensure that the bit has a chance to reach a DC state, e.g., thermal and crystal equilibrium.

In accordance with aspects of the invention, the at least one reference PCE 80 may comprise any number of individual reference PCEs 80a-n that respectively correspond to portions 40a-n of the memory 30. For example, reference PCE 80a may correspond to portion 40a, reference PCE 80b may correspond to portion 40b, reference PCE 80n may correspond to portion 40n, etc. The portions 40a-n may be defined in any desired manner. For example, each respective one of the reference PCEs 80a-n may correspond to a bitline in the memory 30, or a wordline in the memory 30, or any other desired grouping of PCE cells in the memory 30. In embodiments, each respective reference PCE 80a-n may be individually cycled and monitored for controlling the associated respective portion 40a-n. For example, reference PCE 80a may be cycled and monitored to control (e.g., prevent or permit) read/write operations to portion 40a, reference PCE 80b may be cycled and monitored to control read/write operations to portion 40b, and so forth.

Figure 2:
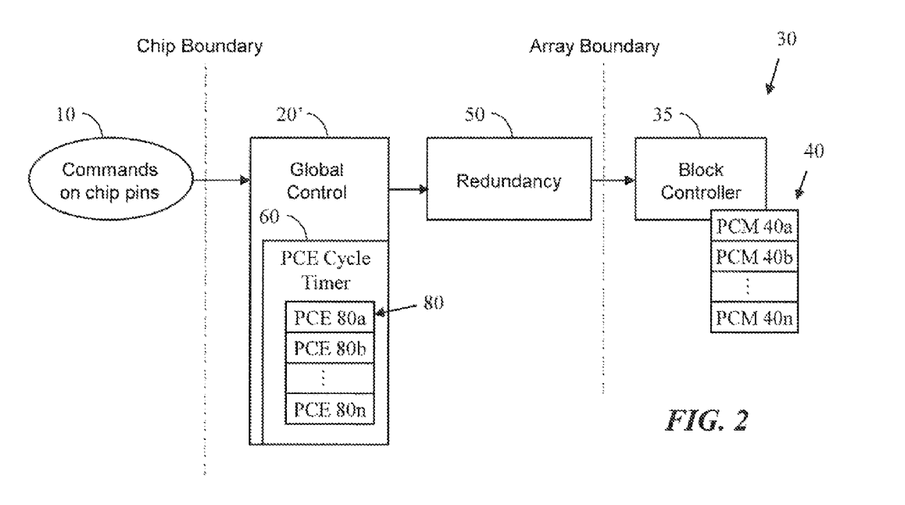
FIG. 2 shows a block diagram of another memory system in accordance with aspects of the invention.

FIG. 2 shows another memory control system according to aspects of the invention. Like the system in FIG. 1, the system in FIG. 2 includes commands 10, a global control 20', a memory 30, and a redundancy cache 50. In the system of FIG. 2, however, the PCE cycle timer 60 is incorporated into the global control 20' rather than being a separate element, as in the system of FIG. 1. Integration of the PCE cycle timer 60 into the global control 20' permits elimination of the chip ready pin. Instead, the logic of the global control 20' is configured to prevent read and/or write operations to the memory 30 based on the state of the integrated PCE cycle timer 60.

In embodiments, the redundancy cache 50 operates to permit read operations when the state of the PCE cycle timer 60 prevents reading from the memory 30. For example, each time global control 20' issues a write command to the memory 30, global control 20' also enters the word and address of the word into a register, e.g., an SRAM register, of the redundancy cache 50. The PCE cycle timer 60 is concurrently triggered with the write command, as already described herein. When the PCE cycle timer 60 indicates that the reference PCE 80 is in its equilibrium state, the global control 20' clears the corresponding address from the redundancy cache 50. When a read or write command is issued, the global control 20' checks the address against the redundancy cache 50. If the address is present in the redundancy cache 50, then the global control 20' obtains the data from the redundancy cache 50 rather than the memory 30. On the other hand, if the address of the desired read or write command is not in the redundancy cache 50, then the global control 20' obtains the data from the memory 30.

As described thus far with respect to FIGS. 1 and 2, the PCE cycle timer 60 executes a write operation on the reference PCE 80, which melts the phase change material in the reference PCE 80 in a conventional manner. In alternative embodiments, in order to extend the useable life of the reference PCE 80, the PCE cycle timer 60 applies an amount of current to the reference PCE 80 to electrically break down the reference PCE 80 without melting the phase change material. Since the reference PCE 80 is already in the amorphous state, the cycle timer 60 applies only enough current to fill the charge traps in the phase change material in the reference PCE 80 without melting the material, as in a write operation. After filling the charge traps in the reference PCE 80, the PCE cycle timer 60 monitors the discharge of the charge traps via the resistance of the reference PCE 80.

Performing a high number of write operations on a PCE cell may cause unwanted percolation, e.g., migration, of constituent elements within the material of the PCE cell, which can lead to faulty device performance. Since the reference PCE 80 will likely undergo many more operations than the PCE cells in the memory 30, it is possible for the reference PCE 80 to wear out prior to the PCE cells in the memory 30. Thus, by applying only sufficient current to fill the charge traps of the reference PCE 80 without executing a write operation on the reference PCE 80, embodiments of the invention prolong the usable life of the memory control system. The amount of current to be applied in this situation and the duration of the application of the current will depend on factors such as the material of the reference PCE, etc.

In embodiments, the property of the reference PCE 80 that is monitored by the PCE cycle timer 60 is electrical resistance. Executing a write operation on a reference PCE 80 populates the charge traps of the material of the reference PCE 80 with electrons, which decreases the resistance of the reference PCE 80. After the write operation, the electrons gradually dissipate, e.g., discharge, out of the charge traps, which gradually increases the resistance of the reference PCE 80.

Implementations of the invention utilize a sensing circuit in the PCE cycle timer 60 that detects this changing resistance of the reference PCE 80 after a write operation is performed on the reference PCE 80. In embodiments, the sensing circuit has an output voltage that is based on the detected resistance of the reference PCE 80, and this output voltage is compared to a threshold value. When the output voltage is on one side of the threshold value (e.g., the output voltage is greater than the threshold value), this indicates that the reference PCE 80 is transient and has not yet reached an equilibrium state, which causes the system to prevent a subsequent operation to the portion of memory 30 associated with the reference PCE 80. On the other hand, when the output voltage is on the other side of the threshold value (e.g., the output voltage is lower than the threshold voltage), this indicates that the reference PCE 80 has reached an equilibrium state, and the system permits a subsequent operation to the portion of memory 30 associated with the reference PCE 80.

Figure 3:
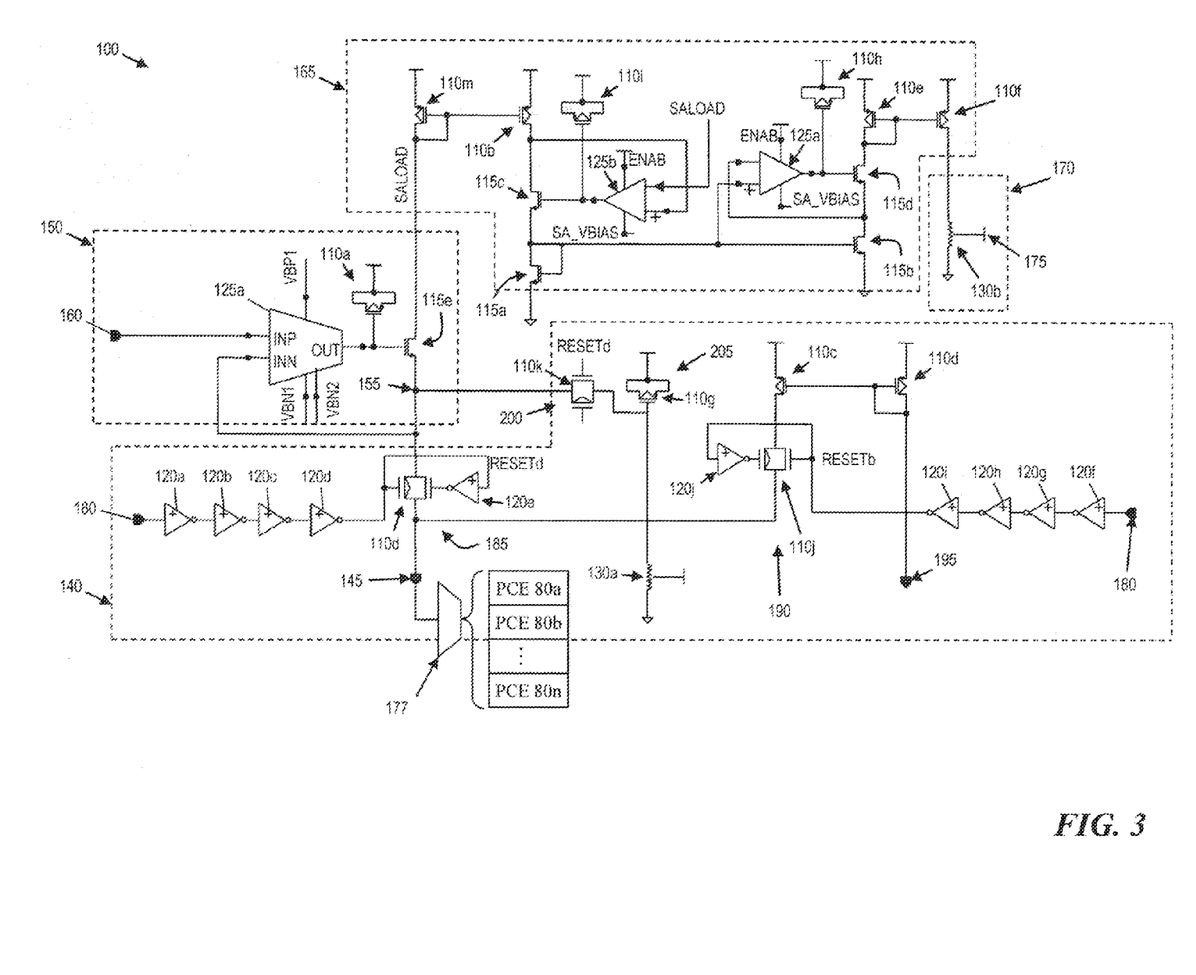
FIG. 3 shows a monitoring circuit in accordance with aspects of the invention.

FIG. 3 depicts an exemplary implementation of a circuit 100 comprised in the PCE cycle timer 60 in accordance with aspects of the invention. The circuit 100 is embodied in a semiconductor structure and comprises an arrangement of pFET devices 110a-m, nFET devices 115a-e, inverters 120a-j, operational amplifiers 125a-c, and resistors 130a-b. The circuit 100 represents an arrangement of devices for executing a write operation to a reference PCE (e.g., reference PCE 80), monitoring the resistance of the reference PCE, and providing an output voltage that is based on the monitored resistance and is indicative of whether the reference PCE is in a transient or equilibrium state, as described above with respect to FIGS. 1 and 2. The circuit 100 is but one exemplary implementation of the invention, and is not intended to limit the invention; rather, any suitable circuit could be used within the scope of the invention to monitor any desired property of the reference PCE and provide an output that is based on the monitored property and is indicative of whether the reference PCE is in a transient or equilibrium state.

In embodiments, the circuit 100 includes a first subsystem 140 that operates as a write current mirror and a sense/write multiplexer (e.g., a switching mechanism) or a bitline 145. The circuit 100 also includes a second subsystem 150 that operates as a voltage clamp that clamps sense node 155 to input voltage 160. The circuit 100 further includes a third subsystem 165 that operates as a current mirror with gain. The circuit 100 additionally includes a fourth subsystem 170 that operates as a converter comprising a voltage output mirror node 175.

In additional embodiments, the bitline 145 of the circuit 100 is connected to a plurality of reference PCE 80a-n by a switching device 177. The switching device 177 may comprise, for example, a multiplexer that selectively and exclusively places one of the plurality of reference PCE 80a-n in communication with the bitline 145. In this manner, a single circuit 100 may be used to monitor plural reference PCE 80a-n that respectively correspond to plural portions 40a-n or memory 30. Alternatively, a single reference PCE may be connected to bitline 145 eliminating the need for a switching device 177.

Referring more specifically to first subsystem 140, input 180 is a variable input corresponding to a RESET pulse that is used to start the PCE cycle timer (e.g., PCE cycle timer 60). In embodiments, the input 180 is applied and at two nodes in the first subsystem 140 and, thus, is shown at two locations in FIG. 3. For example, input 180 is normally at a logic low state. When the global control (e.g., global control 20) triggers the PCE cycle timer, the input 180 is pulsed to a logic high state for a predetermined amount of time. When the input 180 is transitioned to logic high, the sense pass gate 185 is closed and the write pass gate 190 is opened, which causes input current 195 to be applied to the bitline 145. In this manner, a write portion of the circuit is electrically connected to the reference PCE while a sense portion of the circuit is electrically disconnected from the reference PCE.

In embodiments, the input current 195 is a static current that is applied to the reference PCE (e.g., reference PCE 80) during the RESET pulse to execute a write operation on the reference PCE or, alternatively, electrically break down the reference PCE and fill the charge gaps, as described above. In embodiments, the input current 195 is about 10 microamps and the RESET pulse of input 180 has a duration of about 10 nanoseconds; however, the invention is not limited to these values and any suitable values may be used within the scope of the invention. For example, the duration of the RESET pulse and the magnitude of the input current 195 may be tailored to the physical properties of the reference PCE 80 to attain melting (or electrical breakdown and charge trap filling) during the RESET pulse.

Still referring to first subsystem 140, when the RESET pulse of the input 180 transitions from high to low at the end of the pulse, the write pass gate 190 closes and the sense pass gate 185 opens. When the sense pass gate 185 opens, the reference PCE is electrically connected to sense node 155 via the bitline 145, which connection permits the circuit to monitor (e.g., detect) the resistance of the reference PCE, In this manner, the sense portion of the circuit is electrically connected to the reference PCE while the write portion of the circuit is electrically disconnected from the reference PCE. The resistance of the reference PCE changes over time as the charge traps of the reference PCE empty. The sensing circuit, e.g., subsystems 150, 165, and 170, produces a voltage at mirror node 175 that is based on the resistance of the reference PCE: In this manner, the voltage at mirror node 175 changes as the resistance of the reference PCE changes. Accordingly, aspects of the invention involve performing a write operation on the reference PCE and substantially immediately thereafter continuously sensing and returning a value of a resistance of the reference PCE throughout a settling time of the reference PCE.

In embodiments, when the voltage at mirror node 175 is greater than a threshold value, the reference PCE is deemed to have not yet reached an acceptable equilibrium state, and the PCE cycle timer prevents subsequent operations to the portion of the memory (e.g., memory 30) corresponding to the reference PCE. In further embodiments, when the voltage at mirror node 175 falls below the threshold value, the reference PCE is deemed to have reached an acceptable equilibrium state and the PCE cycle timer permits another operation to the portion of the memory corresponding to the reference PCE. As such, the threshold may be based on a thermoelectric equilibrium of the reference PCE.

In accordance with aspects of the invention, the first subsystem 140 comprises a first chain of inverters 120*a-d* and a second chain of inverters 120*f-i* that act as respective buffers for the RESET pulse of input 180. In embodiments, the inverters 120*a-d* and 120*f-i* are configured such that on the rising edge of the RESET pulse the sense pass gate 185 closes before the write pass gate 190 opens, with there being a slight delay between the closing of the sense pass gate 185 and the opening of the write pass gate 190. The inverters 120*a-d* and 120*f-i* are also configured such that on the falling edge of the RESET pulse the write pass gate 190 closes before the sense pass gate 185 opens, with there being a slight delay between the closing of the write pass gate 190 and the opening of the sense pass gate 185. This configuration prevents unwanted charge from traveling from the bitline 145 to the sense node 155 upon completion of the write to the reference PCE. The delay between the write operation and the sensing at the falling edge of the RESET pulse may be set to any desired value. In embodiments, the delay is about 1 ns to about 2 ns, such that the sensing occurs substantially immediately after the write operation on the reference PCE.

According to even further aspects of the invention, a shunt path comprising gate 200, capacitor 205, and resistor 130*a* is connected to the sense node 155. When the RESET pulse is logic high, the gate 200 is open which provides a bias current to the sense node 155 during the write operation to the reference PCE. In this manner, during the write operation, the sense node 155 is tied to an operational voltage rather than being open or grounded. In embodiments, the properties of the resistor 130*a* are tailored such that the current applied to sense node 155 during the write operation is similar to the expected current at sense node 155 generated by the resistance of the reference PCE immediately upon opening of the sense pass gate 185 (e.g., after a write is performed on the reference PCE). For example, the resistor 130*a* may have a resistance of about 10 kΩ, although the invention is not limited to this resistance and any suitable resistor may be used within the scope of the invention.

In embodiments, the second subsystem 150 comprises an op-amp 125*a* and an nFET clamp device 115*e*. This device configuration clamps the sense node 155 to the input voltage 160. In embodiments, the input voltage 160 is a static voltage having a sufficiently small magnitude such that the sensing circuit does not disturb the thermo-electrical behavior of the reference PCE. In embodiments, the input voltage is about 0.05 volts to about 0.1 volts, although the invention is not limited to this voltage and any suitable input voltage may be used within the scope of the invention.

In accordance with additional aspects of the invention, the third subsystem 165 comprises a plurality of current mirrors with respective gains tailored to the other devices of the circuit 100. The third subsystem 165 also includes two op-amps 125*b* and 125*c* with associated nFET devices 115*c* and 115*d* that create an identical Vds from the load to the mirror devices for the associated current mirrors. For example, for a first current mirror, the Vds of pFET 110*b* is identical to the Vds of pFET 115*j*. Similarly, for a second current mirror, the Vds of nFET 115*a* is identical to the Vds of nFET 115*b*. This creates a very accurate mirror system with gain. In exemplary embodiments, there are three current mirror having gains of 10×, 5×, and 1×, respectively, for a total current gain of 50×. Moreover, the current coming into the third subsystem 165 from nFET clamp 115*e* may be about 1 microamp. However, the invention is no limited to these exemplary values, and other numbers of current mirrors, other gains, and other magnitudes of incoming current may be used within the scope of the invention.

In embodiments, the fourth subsystem 170 comprises the output mirror node 175 and a load device, e.g., resistor 130*b*. The output voltage at mirror node 175 equals the final output current of the third subsystem 165 multiplied by the resistance of resistor 130*b*. More specifically, the voltage at mirror node 175 is equal to the resistance of resistor 130b multiplied by the gain of the third subsystem 165 multiplied by the input voltage 160 divided by the resistance of the reference PCE. Thus, the voltage at mirror node 175 changes as the resistance of the reference PCE changes. For example, in an illustrative embodiment of the invention, the resistor 130b has a resistance of 4 kΩ, the third subsystem has a gain of 50×, and the input 160 is 0.1 v. In this configuration, the voltage of mirror node 175 is 2 v when the reference PCE element has a resistance of 10 kΩ, and the voltage of mirror node 175 is 0.2 v when the resistance of the reference PCE element is 100 kΩ.

In embodiments, the output mirror node 175 is tied to a comparator that compares the output voltage to a predetermined threshold. The comparator may in turn be tied to the chip ready pin (e.g., chip ready pin 70) or may be operatively connected to or integrated in the global control (e.g., global control 20'). As described herein, subsequent read/write operations are prevented when the output voltage is greater than the threshold, and subsequent read/write operations are permitted when the output voltage is less than the threshold. Also, the polarity of the output voltage may be reversed using conventional methods, such that subsequent read/write operations are prevented when the output voltage is less than the threshold, and subsequent read/write operations are permitted when the output voltage is greater than the threshold. In embodiments, the threshold is $\frac{1}{2}(V_{DD})$, although the invention is not limited to this value and any desired threshold may be used within the scope of the invention. In a particular non-limiting embodiment, the output mirror node 175 is a small metal testpoint, rather than a large probe pad, in order to keep the capacitance to a minimum and maximize system response.

Figure 4:
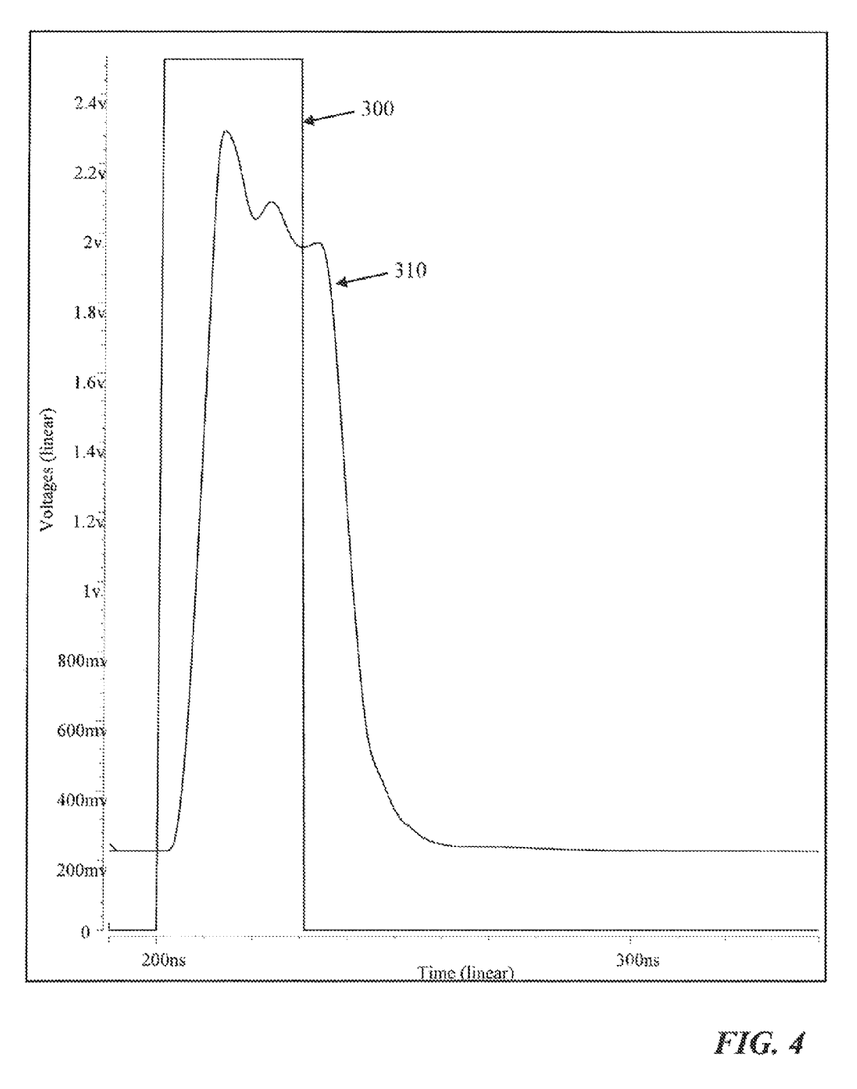
FIGS. 4 and 5 show plots of simulation data associated with operation of circuits in accordance with aspects of the invention.

FIG. 4 shows a simulation of the circuit 100 of FIG. 3 during a write operation in accordance with aspects of the invention. In particular, FIG. 4 shows the RESET pulse and the voltage at mirror node 175. For example, line 300 shows the RESET pulse and line 310 shows the output voltage at mirror node 175 when a write operation is executed on the reference PCE using circuit 100 of FIG. 3. Prior to the rising edge of the RESET pulse, the simulated reference PCE resistance is 100 kΩ which provides an output voltage of about 200 my. The rising edge of the RESET pulse changes the circuit operation from sense to write, connecting the input current 195 to the bitline 145 and the reference PCE element. During the RESET pulse, the sense node 155 is isolated from the bitline 145 by sense pass gate 185. During the write to the reference PCE, the output voltage approaches 2 v, indicating a resistance of 10 kΩ, which is the fixed bias resistance during a write operation. With the fall of the RESET pulse, the circuit 100 returns to the sense operation by closing the write pass gate 190 and opening the sense pass gate 185. The output voltage at mirror node 175 settles at approximately 200 my in about 30 ns, indicating about 100 kΩ reference PCE resistance.

Figure 5:
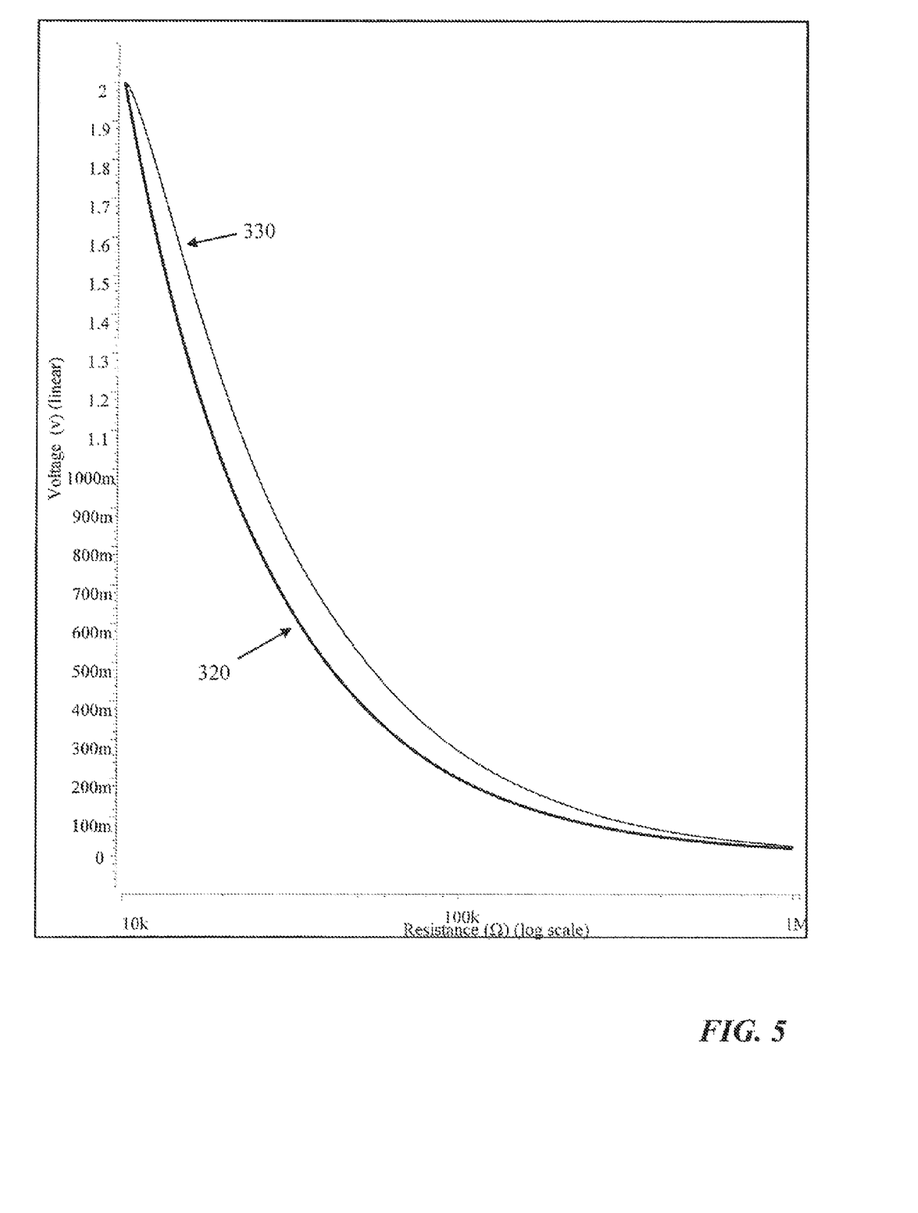

FIG. 5 shows a circuit simulation of the sense performance over a range of PCE resistance from 10 kΩ to 1 MΩ on a log scale. The plot 320 corresponds to an expected value at the mirror node 175 based on ideal circuit operation. The plot 330 shows actual value at mirror node 175. The simulation shows that the output at mirror node 175 correlates well with the expected resistance at the extreme values, e.g., 10 kΩ to 1 MΩ, and slightly over-predicts the PCE resistance for other values in between.

Figure 6:
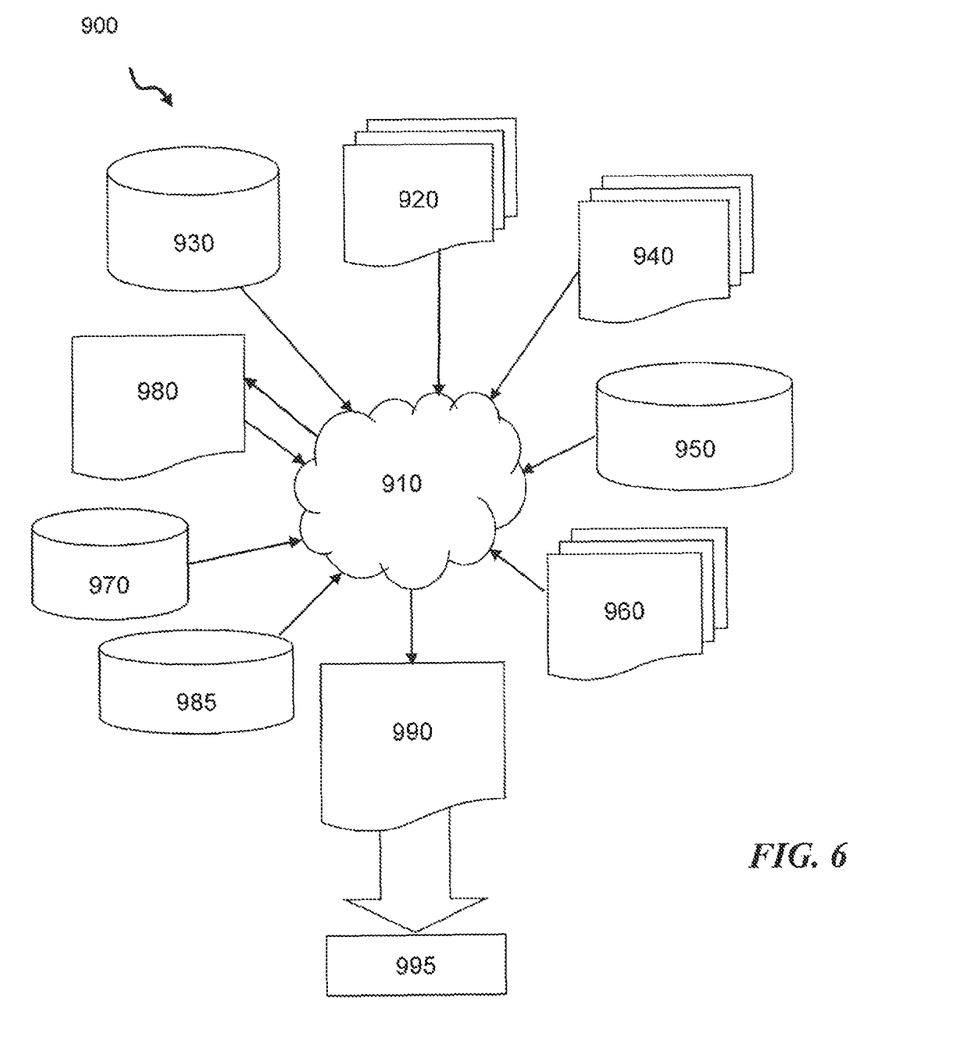
FIG. 6 is a flow diagram of a design process used in semiconductor design, manufacture, and/or test.

FIG. 6 is a flow diagram of a design process used in semiconductor design, manufacture, and/or test. FIG. 6 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-3. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-3. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-3 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-3. In one embodiment, design structure 990 may comprise a compiled, executable HDL simulation model that functionally simulates the devices shown in FIGS. 1-3.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-3. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:
1. A system, comprising:
at least one reference phase change element (PCE); and
a circuit that performs a write operation on the at least one reference PCE and substantially immediately thereafter continuously senses and returns a value of a resistance of the at least one reference PCE.

2. The system of claim 1, wherein the circuit senses and returns the value of the resistance of the at least one reference PCE throughout a settling time of the at least one reference PCE.

3. The system of claim 1, wherein the at least one reference PCE comprises a first reference PCE associated with a first portion of phase change memory (PCM) and a second reference PCE associated with a second portion of PCM.

4. The system of claim 3, further comprising a switching device that connects the first reference PCE to the circuit upon issuance of a write command to the first portion of PCM and connects the second reference PCE to the circuit upon issuance of a write command to the second portion of PCM.

5. The system of claim 1, wherein the circuit converts the resistance to a voltage.

6. The system of claim 5, wherein the system compares the voltage to a threshold value.

7. The system of claim 6, wherein the threshold value is based on a thermoelectric equilibrium of the at least one reference PCE.

8. The system of claim 6, wherein the system determines whether to permit or prevent writing to a portion of phase change memory associated with the at least one reference PCE based upon the comparing the voltage to the threshold value.

9. The system of claim 6, wherein, based on the comparing the voltage to the threshold value, the system holds a chip ready pin at one of a logic high state and a logic low state.

10. The system of claim 1, wherein:
the circuit comprises a write portion and a sense portion;
the write portion is electrically connected to the at least one reference PCE and the sense portion is electrically disconnected from the at least one reference PCE while performing the write operation on the at least one reference PCE; and
the write portion is electrically disconnected from the at least one reference PCE and the sense portion is electrically connected to the reference PCE while performing the sensing.

11. The system of claim 10, wherein the sense portion is electrically connected to the at least one reference PCE after the write portion is electrically disconnected from the at least one reference PCE.

12. A method, comprising:
triggering a cycle timer associated with a portion of phase change memory (PCM), wherein the triggering causes the cycle timer to: execute a write operation on a reference phase change element (PCE) associated with the portion of PCM; and sense a parameter of the reference PCE after the executing the write operation; and
determining whether to permit or prevent subsequent writing to the portion of PCM based upon the sensed parameter.

13. The method of claim 12, wherein the triggering occurs based on an issuance of a write command to the portion of PCM.

14. The method of claim 12, wherein the determining comprises comparing the sensed parameter to a threshold value.

15. The method of claim 14, wherein the threshold value is based on a thermoelectric equilibrium of the reference PCE.

16. The method of claim 12, wherein:
the executing the write operation comprises electrically disconnecting a sense portion of a circuit from the reference PCE and then electrically connecting a write portion of the circuit to the reference PCE; and
the sensing the parameter comprises electrically disconnecting the write portion of the circuit from the reference PCE and then electrically connecting the sense portion of the circuit to the reference PCE.

17. The method of claim 12, wherein the sensed parameter is an electrical resistance of the reference PCE.

18. The method of claim 17, wherein the sensing the parameter comprises continuously sensing the electrical resistance throughout a settling time of the reference PCE.

19. A system, comprising:
a memory controller associated with a phase change memory (PCM) array; and
a cycle timer comprising at least one reference phase change element (PCE), wherein a write command from the memory controller to a portion of the PCM array triggers the cycle timer to fill charge traps of the at least one reference PCE and thereafter continuously sense and return a value of a resistance of the at least one reference PCE.

20. The system of claim 19, wherein:
the cycle timer is separate from and operatively connected to the memory controller;
the cycle timer is operatively connected to a chip ready pin; and
the cycle timer holds the chip ready pin in a logic high state or a logic low state based on a comparison of the resistance to a threshold value.

21. The system of claim 19, wherein:
the cycle timer is integrally comprised in the memory controller; and
based on the comparison of the resistance to a threshold value, the memory controller determines whether to prevent or permit a subsequent write operation on the portion of the PCM array.

* * * * *